(12) United States Patent
McEwen et al.

(10) Patent No.: US 6,627,810 B2
(45) Date of Patent: Sep. 30, 2003

(54) MAGNETIC SHIELD FOR OPTICAL GYROSCOPES

(75) Inventors: Matthew B. McEwen, Phoenix, AZ (US); Jesse A. Vaught, Phoenix, AZ (US); John R. Leonard, Glendale, AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/884,564

(22) Filed: Jun. 19, 2001

(65) Prior Publication Data

US 2003/0000719 A1 Jan. 2, 2003

(51) Int. Cl.[7] ................................................. H05K 9/00
(52) U.S. Cl. ............................. 174/35 MS; 174/35 R
(58) Field of Search ......................... 174/35 R, 35 MS; 361/816, 818, 800

(56) References Cited

U.S. PATENT DOCUMENTS

| | | | |
|---|---|---|---|
| 2,388,848 A | | 11/1945 | Howe .................... 174/35 MS |
| 3,982,058 A | * | 9/1976 | Hill ............................... 174/2 |
| 4,507,520 A | * | 3/1985 | Lindgren ............... 174/35 MS |
| 4,671,658 A | | 6/1987 | Shaw et al. ................. 356/460 |
| 5,061,685 A | * | 10/1991 | Kosuge et al. ............. 505/213 |
| 5,170,009 A | * | 12/1992 | Kadokura ................ 174/35 R |
| 6,037,541 A | * | 3/2000 | Bartley et al. ................ 174/66 |
| 6,121,544 A | * | 9/2000 | Petsinger .................. 174/35 R |
| 6,134,121 A | * | 10/2000 | Braxton ..................... 361/818 |
| 6,232,550 B1 | * | 5/2001 | Mangold .................. 174/52.1 |

* cited by examiner

*Primary Examiner*—Hung V. Ngo
(74) *Attorney, Agent, or Firm*—McDonnell Boehnen Hulbert & Berghoff

(57) ABSTRACT

A magnetic shield has a multiple-layered lid and a multiple-layered base, wherein each layer of the lid is aligned with the corresponding layer of the base. The magnetic shield also includes an alignment mechanism to maintain the alignment of the corresponding layers of the lid and the base of the shield.

12 Claims, 4 Drawing Sheets

MAGNETIC SHIELD FOR OPTICAL GYROSCOPES

Government has acquired certain rights in this invention pursuant to Contract No. DAAH01-95-C-R147 awarded by the U.S. Army Aviationa and Missile Command.

FIELD OF THE INVENTION

The present invention relates to the field of optical gyroscopes. More specifically, the invention relates to the magnetic shielding of an optical gyroscope.

BACKGROUND OF THE INVENTION

A key performance parameter for optical gyroscopes, such as fiber optic and similar optic gyroscopes used for inertial sensing, is bias sensitivity to magnetic fields. Sources of magnetic flux include the Earth's magnetic field, electrical machinery, etc. For a fiber gyroscope used in inertial navigation systems, the allowable magnetic sensitivity of the instrument bias is between 0.001 and 0.0001 degree per hour per guass (deg/hr/guass). The inherent sensitivity of an unshielded gyroscope is 1 deg/hr/gauss.

The most effective method to reduce the bias sensitivity to magnetic field is to reduce the magnitude of the local field by the addition of a magnetically shielding structure ("magnetic shield") around the optics. Magnetic shields are made of a high permeability shielding material that will function as a preferred path for an ambient field. Essentially, the magnetic shield creates a high-permeability path for the magnetic field in order to reroute the magnetic field around the optical gyroscope inside the shield, thereby reducing the effect on bias.

Performance of the magnetic shield is determined by the overall size, shape, and composition of the container, as well as magnitude of the ambient field. One variable included in the size and shape, is the number of distinct layers of shielding material present in the shield. These layers are separated from each other by a non-magnetic material or by a vacancy. One variable which affects the performance of a multi-layered shield is the size of this gap between the shield layers. Another performance variable is the mating method of multi-piece shield.

Presently, magnetic shields are usually two-piece assemblies, namely a lid and a base, where one piece overlaps the other. This overlapping results in the inside layer of the lid mating on the outside surface of the outer layer of the base. This overlap creates a discontinuity in the ambient field paths created by each shielding layer. Thus, the result is not a true multi-layered shielding effect since there are not separate paths that the magnetic field lines can travel.

Accordingly, it is desirable to provide a magnetic shield having a multiple-layered lid and a multiple layered base, wherein each layer of the lid is aligned with the corresponding layer of the base to create a continuous multi-layered shield throughout the joint of the lid and the base of the shield. The present invention provides such a mated shield with a true multi-layered shielding effect, which results in improved suppression of the magnetic field surrounding the gyroscope.

It is further desirable to provide an alignment mechanism to maintain the mating of the lid and the base of a magnetic shield while the shield is in use. The present invention provides such an alignment mechanism. In the present invention, the alignment mechanism ensures that the continuous ambient fields created by the layers of a shield will not be disrupted during the use of a gyroscope.

SUMMARY OF THE INVENTION

The present invention provides a magnetic shield having a multiple-layered lid and a multiple layered base, wherein each layer of the lid is aligned with the corresponding layer of the base. The present invention also provides an alignment mechanism to maintain the alignment of the corresponding layers of the lid and the base of the shield.

DETAILED DESCRIPTION OF THE PREFERRED EMBODIMENTS

Figure 1:
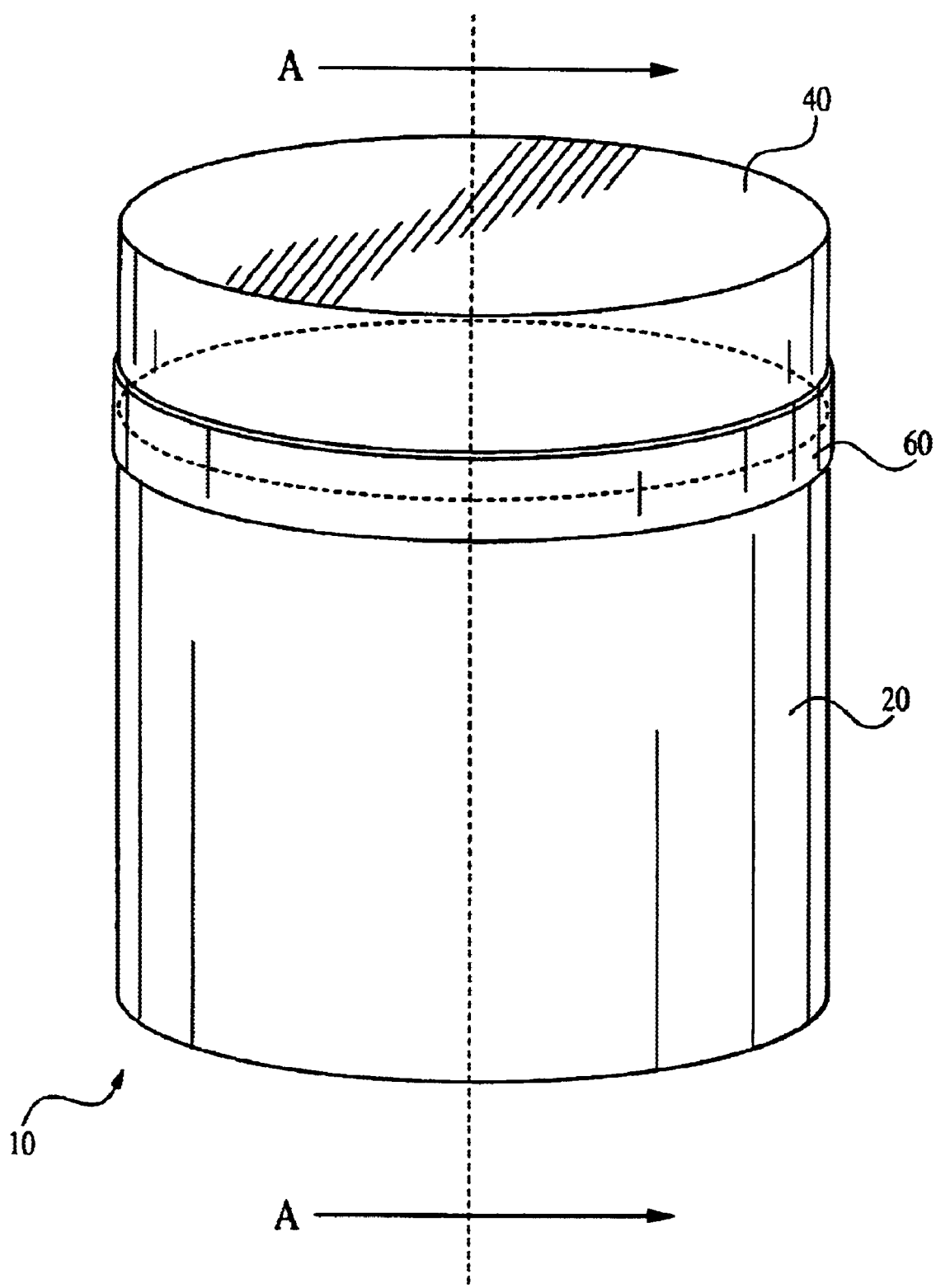
FIG. 1 is a perspective view of a magnetic shield of the present invention.
Figure 2:
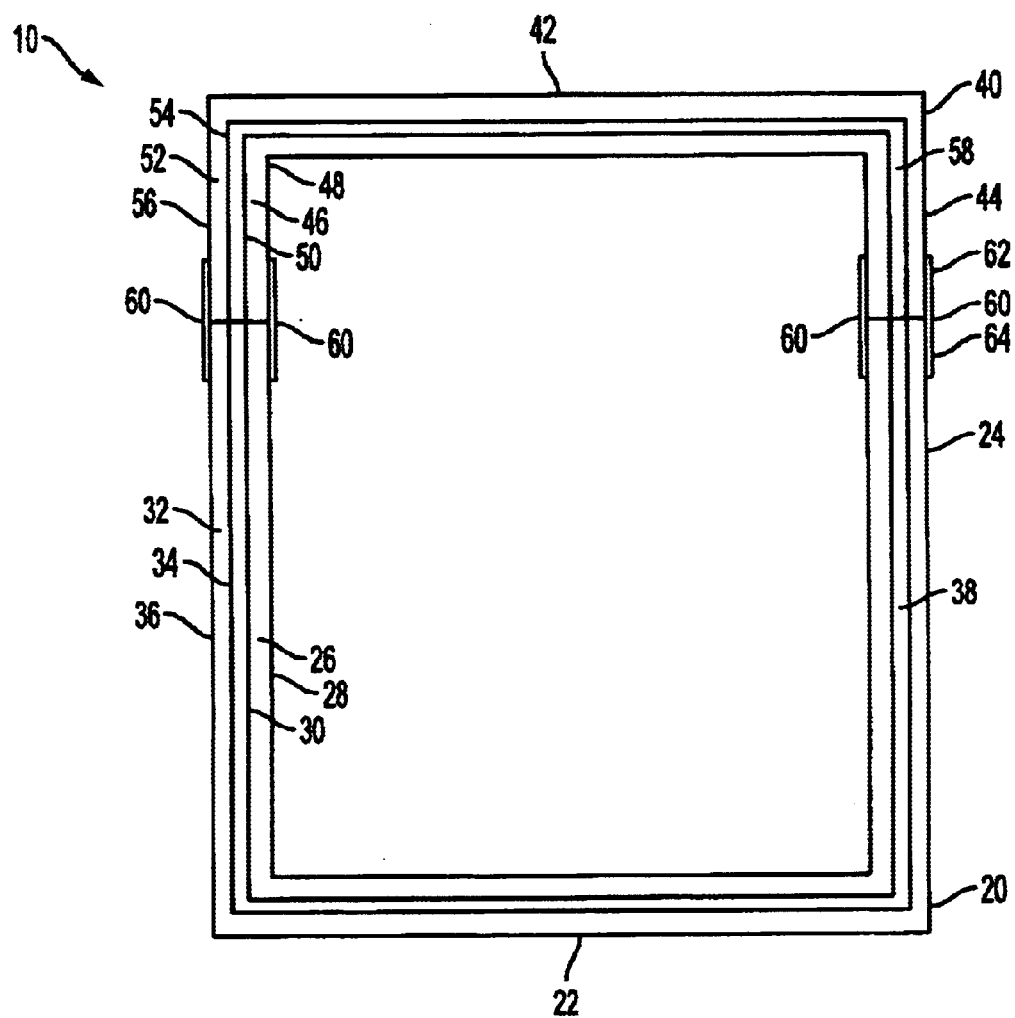
FIG. 2 is a cross sectional view of the magnetic shield of FIG. 1, taken along line A—A.

Turning now to the drawings, FIGS. 1–2 show a preferred embodiment of a magnetic shield 10 of the present invention. The magnetic shield generally comprises a base 20, a lid 40, and an alignment mechanism 60. It should be understood, however, that the magnetic shield 10 may be comprised of fewer or more components, depending on manufacturing and consumer preferences. Furthermore, while the magnetic shield 10 shown in FIGS. 1–2 is cylindrical in shape, it should be understood by those of skill in the art that the shape and size of the magnetic shield will vary depending upon the shape and size of the gyroscope being enclosed by the shield.

The base 20 has a bottom end 22 and side walls 24. Both the bottom end and the side walls of the base of the magnetic shield 10 preferably comprise at least a first layer 26, having an inner surface 28 and an outer surface 30, and a second layer 32, having an inner surface 34 and an outer surface 36. A layer of air 38 separates the first layer 26 and the second layer 32 of the base 20. Preferably, the bottom end 22 and side walls 24 of the base are integral to each other, with side walls 24 outwardly extending from the bottom end 22. However, it should be understood that a base in which the bottom end and the side walls are connected, but not integral (i.e., separate), may also be used with the present invention.

The lid 40 of the magnetic shield 10 preferably has a top end 42 and side walls 44. Both the top end and the side walls of the lid preferably comprise at least a first layer 46, having an inner surface 48 and an outer surface 50, and a second layer 52, having an inner surface 54 and an outer surface 56. A layer of air 58 preferably separates the first layer 46 and second layer 52 of the lid 40. As with the base 20, the top end 42 and side walls 44 of the lid 40 are, preferably, integral to each other, with the side walls 44 outwardly extending from the top end 47. However, it should be understood that a lid in which the top end and the sides are connected, but not integral (i.e., separate), may be used with the present invention.

The lid 40 is defined as the portion of the shield which includes the top end 42 of the magnetic shield. Likewise, the base 20 is defined as the portion of the shield which includes the bottom end 22 of the magnetic shield.

Figure 3:
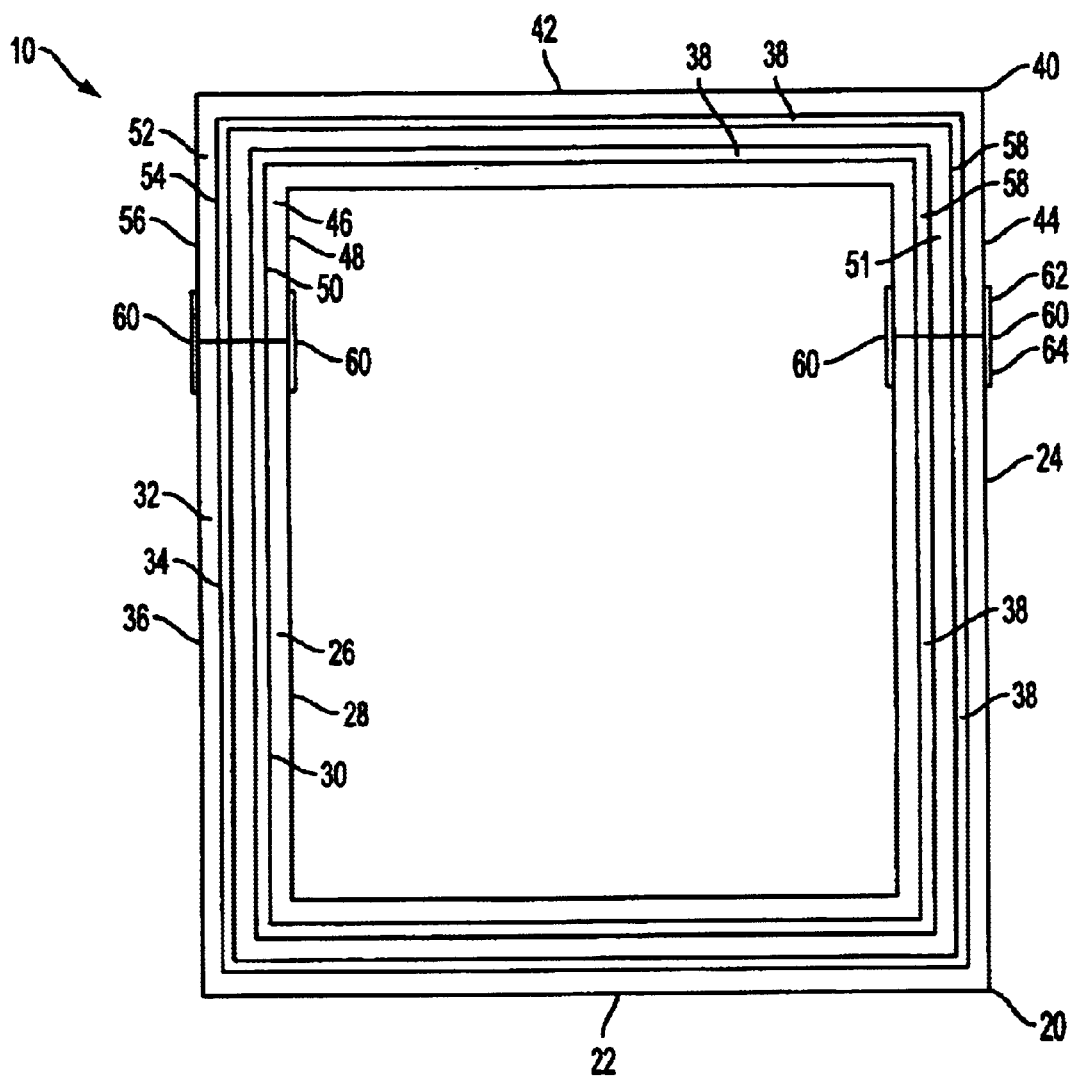
FIG. 3 is a cross sectional view of a magnetic shield of the present invention having three layers.

The layers of the lid and the base are preferably made of high permeability shielding material, such as wrought nickel-iron soft magnetic alloys. More preferably, the layers of the lid and base are made of nickel-iron alloys falling under military specification MIL-N-14411 (composition 1 & 2) or American Society for Testing and Materials (ASTM) specification A753-97, both of which are specifically incorporated herein by reference. However, the same shielding material need not be used for both the inner and the outer layers. Preferably, the inner layer of the lid is composed of the same material as the corresponding layer in the base, and the outer layer of the lid is composed of the same material as the corresponding layer in the base. Furthermore, additional layers of high permeability shielding material may be added between the inner and outer layers. FIG. 3 shows an alternative embodiment of the present invention where an intermediate layer of shielding material 51 is positioned between the outer surface of the inner layer and the inner surface of the outer layer. Hence, as shown in FIG. 3, a triple-layer or magnetic shield may be used in this invention. It is also contemplated that more than three layers may be used with the magnetic shield of the present invention.

The inner and outer layers of the shield are often separated by a layer of air 38 and 58, as shown in FIG. 2. Although not shown, a layer of low magnetic permeability material may be situated between the high magnetic permeability layers in addition to or in place of the layer of air. This low magnetic permeability layer may be made of any non-ferrous material, such as copper, aluminum, stainless steel or plastic.

The alignment mechanism 60 functions to maintain alignment of the layers of the lid with the corresponding layers of the base at the joint of the lid 40 and base 20. In the preferred embodiment, as exemplified in FIG. 1, the alignment mechanism is a band of material having a upper portion 62 and a lower portion 64. This band may be affixed to the shield 10 in any manner or orientation that maintains the alignment of the layers of the lid 40 and the base 20. For example, the upper portion 62 of the band may be affixed to the outer surface 56 of the second layer 52 of the lid 40; the upper portion 62 of the band may be affixed to the inner surface 54 of the first layer 46 of the lid 40; the lower portion 64 of the band may be affixed to the outer surface 36 of the second layer 32 of the base 20; or the lower portion 64 of the band may be affixed to the inner surface 28 of the first layer 26 of the base 20. Furthermore, more than one band may be affixed to the shield to maintain this alignment. This is illustrated in FIG. 2, where a first band is attached to the outside surface of the second layer and a second band is attached to the inner surface of the first layer. This type of alignment mechanism gives the additional benefit of connecting the shield layers where discontinuities occur caused by tolerancing and manufacturing, thereby further improving the performance of the shield.

Figure 4:
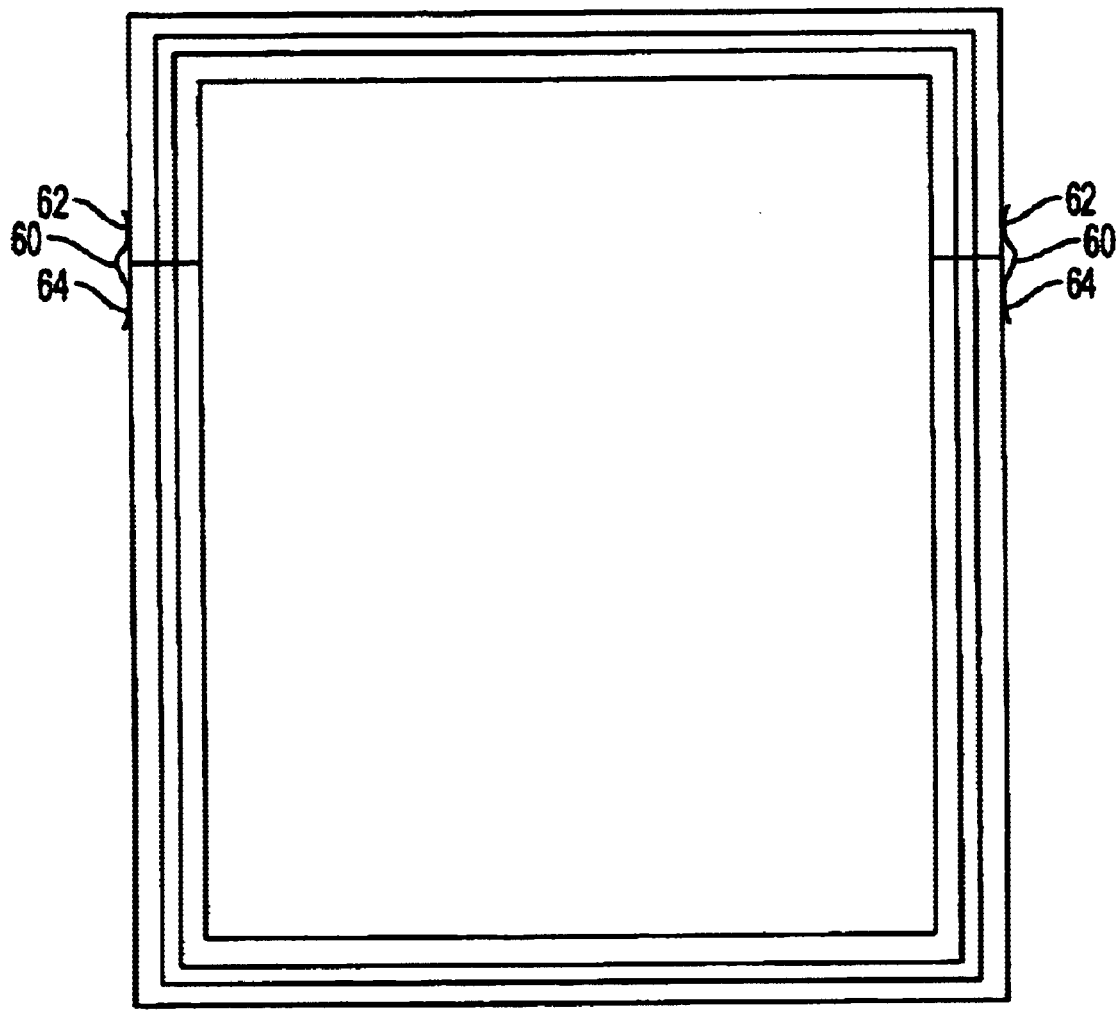
FIG. 4 is a cross sectional view of a magnetic shield of the present invention having an alternative alignment mechanism.

Although a band of material is the preferred alignment mechanism, those of skill in the art will understand that the alignment mechanism may be any type of mechanism which will maintain the alignment of the layers of the lid and the layers of the base during the use of the magnetic shield. Such alternative alignment mechanisms may include one or more flanges, clasps, clips or hinges. Each of these alternative alignment mechanisms preferably will have an upper portion and a lower portion, with either portion being affixed to the shield in a manner which maintains the alignment of the lid and the base. FIG. 4 is an example of a shield of the present invention having a flange as the alignment mechanism.

Each alignment mechanism is preferably made of a high permeability shielding material, such as wrought nickel-iron soft magnetic alloys. More preferably, the layers of the lid and base are made of nickel-iron alloys falling under military specification MIL-N-14411 (composition 1 & 2) or American Society for Testing and Materials (ASTM) specification A753-97. In one preferred embodiment of the present invention, the alignment mechanism is composed of the same material as the layer of the shield to which it is affixed.

The magnetic shield of the present invention may be used in the following manner. The layers of the lid of the shield are mated with the corresponding layers of the base of the shield to ensure continuous contact between each layer of the lid and the base. For example, in FIG. 2 the inner layer of the lid is aligned with the inner layer of the base such that these inner layers are in contact at the joint of the lid and base. Likewise, the outer layer of the lid is aligned with the outer layer of the base such that these outer layers are in contact at the joint of the lid and base.

In order to maintain this alignment of the shield layers during the use of the shield, the present invention utilizes an alignment mechanism, such as a thin band. The alignment mechanism holds the lid and the base in place with respect to one another, thereby keeping their layers aligned, and preventing them from becoming misaligned due to movement by either the lid or the base. This alignment of the layers of the lid with the layers of the base results in continuous ambient fields created by the layers of the magnetic shield. The ambient fields are a redirection of the magnetic fields surrounding the gyroscope, thereby reducing the effect on the gyroscope from these magnetic fields. This reduced sensitivity gives the gyroscope improved accuracy and reduces the chance of a sudden error due to an exposure to a magnetic field. Furthermore, the magnetic shield is also electrically conductive, which imparts some electrical shielding for the electronic components of the gyroscope inside the shield.

It should be understood that a wide range of changes and modifications can be made to the embodiments of the magnetic shield described above. For instance, the size and shape of the magnetic shield, the materials used to create the magnetic shield, the number of layers used in the shield and the type of alignment mechanism utilized with the magnetic shield, may be different than the exemplary embodiments described above, depending upon consumer and manufacturing preferences. It is therefore intended that the foregoing description illustrates rather than limits this invention, and that it is the following claims, including all equivalents, which define this invention.

We claim:

1. A magnetic shield comprising:
    a cylindrical lid having a diameter a first layer, having an inner surface and an outer surface, and a second layer having an inner surface and an outer surface;
    a cylindrical base with said diameter and having a first layer, having an inner surface and an outer surface, and a second layer having an inner surface and an outer surface;
    wherein the first layer of the lid is aligned with the first layer of the base when the shield is in use; and
    an alignment mechanism to maintain alignment of the lid and a base so that their respective and inner outer surfaces are collinearly aligned, said mechanism comprising a circular band that receives said lid and said base along collinear surfaces of said lid and said base.

2. The magnetic shield of claim 1 wherein said band is located along the circumference of said lid and said base.

3. The magnetic shield of claim 2 comprising a second circular band located along the inner circumference of said base and said lid.

4. The magnetic shield of claim 2 wherein the upper portion of the alignment mechanism is affixed to the inner surface of the first layer of the lid.

5. The magnetic shield of claim 4 wherein the alignment mechanism is composed of the same material as the first layer of the lid.

6. The magnetic shield of claim 2 wherein the lower portion of the alignment mechanism is affixed to the inner surface of the first layer of the base.

7. The magnetic shield of claim 6 wherein the alignment mechanism is composed of the same material as the first layer of the base.

8. The magnetic shield of claim 1 wherein the first layer of the lid and the first layer of the base are composed of a first material and the second layer of the lid and the second layer of the base are composed of a second material.

9. The magnetic shield of claim 8 wherein the first material is a nickel-iron soft magnetic alloy.

10. The magnetic shield of claim 8 wherein the second material is a nickel-iron soft magnetic alloy.

11. The magnetic shield of claim 8 wherein the first material is different from the second material.

12. The magnetic shield of claim 1 wherein:

one or more intermediate layers are located between the outer surface of the first layer of the lid and the inner surface of the second layer of the lid; and one or more intermediate layers are located between the outer surface of the first layer of the base and the inner surface of the second layer of the base.

* * * * *